United States Patent [19]
Ougazzaden et al.

[11] Patent Number: 6,141,363
[45] Date of Patent: *Oct. 31, 2000

[54] OPTICAL SEMICONDUCTOR LIGHT GUIDE DEVICE HAVING A LOW DIVERGENCE EMERGENT BEAM, APPLICATION TO FABRY-PEROT AND DISTRIBUTED FEEDBACK LASERS

[75] Inventors: Abdallah Ougazzaden, Fontenay aux Roses; Noureddine Bouadma, Gentilly; Christophe Kazmierski, Morangis, all of France

[73] Assignee: France Telecom, Paris, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/867,491

[22] Filed: Jun. 2, 1997

[30] Foreign Application Priority Data

Jun. 4, 1996 [FR] France ................................... 96 06877

[51] Int. Cl.$^7$ .................................................... H01S 3/085
[52] U.S. Cl. .............................................. 372/45; 385/131
[58] Field of Search ................................. 372/45, 46, 50; 385/131

[56] References Cited

U.S. PATENT DOCUMENTS

| 4,817,110 | 3/1989 | Tokuda et al. | 372/45 |
| 5,304,283 | 4/1994 | Bouadma | 156/643 |
| 5,812,575 | 9/1999 | Choi | 372/45 |

FOREIGN PATENT DOCUMENTS

| 578836 | 1/1994 | European Pat. Off. . | |
| 2-228088 | 9/1990 | Japan | 372/45 |
| 5/55697 | 5/1993 | Japan | 372/45 |

OTHER PUBLICATIONS

Li G P et al: "1.55UM Index/Gain Coupled DFB Lasers With Strained Layer Multiquantum–Well Active Grating", Electronics Letters, vol. 28, No. 18, Aug. 27, 1992, pp. 1726–1727, XP000309478.

Electronics Letters, vol. 31, No. 10, May 11, 1995, pp. 803–805, XP000518299, Ougazzaden A. et al., "High Temperature Characteristic to and Low Threshold Current Density of 1.3UM INASP/INGAP/INP Compensated Strain Multiquantum Well Structure Lasers".

Electronics Letters, Mar. 26, 1992, vol. 28, No. 6, pp. 631–632, R. Zengerle et al., "Low–Loss Fibre–Chip Coupling by Buried Laterally Tapered InP/InGaAsP Wave–Guide Structure".

Journal of Lightwave Technology, vol. 13, No. 9, Sep. 1995, pp. 1865–1872, B. Mersali et al., "Theoretical and Experimental Studies of Spot–Size Transformer With Integrated Waveguide for Polarization Insensitive Optical Amplifiers".

(List continued on next page.)

*Primary Examiner*—James W. Davie
*Attorney, Agent, or Firm*—Pearne & Gordon LLP

[57] ABSTRACT

Optical semiconductor light guide device having a low divergence emergent beam, application to Fabry-Pérot and distributed feedback lasers. According to the invention, the core of the guide of the device comprises at least one semiconductor layer (8), whose refractive index is higher than that of each of the confinement or cladding layers (4, 6) of the guide and at least one second semiconductor layer (10), whose refractive index is lower than that of each of the confinement or cladding layers or close thereto. Application to optical telecommunications.

15 Claims, 4 Drawing Sheets

OTHER PUBLICATIONS

Electronics Letters, Oct. 12, 1995, vol. 31, No. 21, pp. 1838–1840, Y. Tohmori et al., "High Temperature Operation With Low–Loss Coupling to Fibre for Narrow–Beam 1.3 um Lasers with Butt–Jointed Selective Grown Spot–Size Converter".

Proc. 21st. Eur. Conf. on Opt. Comm. (ECOC 95–Brussels), H. Fukano et al., "Low Cost, High Coupling–Efficient and Good Temperature Characteristics 1.3 um Laser Diodes Spot–Size Transformer".

Electronics Letters, May 11, 1995, vol. 31, No. 10, pp. 803–804, A Ougazzaden et al., "High Temperature Characteristics to and Low Threshold Current Density of 1.3 um InAsP/InGaP/InP Compensated Strain Multiquantum Well Structure Lasers".

Electronics Letters, Aug. 17, 1995, vol. 31, No. 17, pp. 1439–1440, H. Fukano et al., "1.3 um Large Spot–Size Laser Diodes Laterally Tapered Active Layer".

Appl. Phys. Lett., 64(5), Jan. 31, 1994, pp. 539–541, P. Doussiere et al., "Tapered Active Stripe for 1.5 um InGaAsP/InP Strained Multiple Quantum Well Lasers with Reduced Beam Divergence".

Electronics Letters, Mar. 16, 1995, vol. 31, No. 6, pp. 452–454, I. Moerman et al., "InGaAsP/InP Strained MQW Laser with Integrated Mode Size Converter Using the Shadow Masked Growth Technique".

Electronics Letters, Sep. 29, 1994, vol. 30, No. 20, pp. 1685–1687, I.F. Lealman et al., "InGaAsP/InP Tapered Active Layer Multiquantum Well Laser with 1.8 dB Coupling Loss to Cleaved Single Mode Fibre".

IEEE Photonics Technology Letters, vol. 6, No. 12, Dec. 1994, pp. 1412–1414, R. Ben–Michael et al., "InP–based Multiple Quantum Well Lasers with an Integrated Tapered Beam Expander Waveguide".

Electronics Letters, Mar. 30, 1995, vol. 31, No. 7, pp. 559–560, A Kasukawa et al., "Output Beam Characteristics of 1.3 um GaInAsP/InP SL–QW Lasers with Narrow and Circular Output Beam".

Patent Abstracts of Japan, vol. 011, No. 011 (E–470), Jan. 13, 1987 & JP 61 184895 A (Mitsubishi Electric Corp), Aug. 18, 1986.

Patent Abstracts of Japan, vol. 009, No. 310 (E–364), Dec. 6, 1985 & JP 60 145687 A (Nippon Denki KK) Aug. 1, 1985.

Patent Abstracts of Japan, vol. 013, No. 144 (E–740), Apr. 10, 1989 & JP 63 306686 A (Oki Electric Ind. Co. Ltd.), Dec. 14, 1988.

OPTICAL SEMICONDUCTOR LIGHT GUIDE DEVICE HAVING A LOW DIVERGENCE EMERGENT BEAM, APPLICATION TO FABRY-PEROT AND DISTRIBUTED FEEDBACK LASERS

TECHNICAL FIELD

The present invention relates to an optical semiconductor light guide device with a low or small divergence emergent beam.

It more particularly applies to the field of optical telecommunications and more especially transmissions by optical fibre at 1.3 and 1.5 µm for subscriber service distribution applications.

In order to generalize this type of optical link, it is vital to reduce the cost of the end optoelectronic components respecting the requirements of high performance, robustness and stability in the temperature range −40° C. to +85° C.

An important part of the costs is due to assembly and fibre drawing operations, which at present are individual operations.

An end component (optical head) essentially comprises a chip (e.g. having a laser amplifier, a modulator or a detector) and a fibre, which must be aligned and fixed in front of the active part of the chip.

In the particular case of the laser, with a typical beam divergence of 30 to 40°, said operation requires a submicron positioning precision of the fibre in order to obtain the optimum coupling rate of the optical power in the fibre and consequently optimum performance characteristics of the component.

This precision involves complex and costly installation and fibre drawing procedures, which consume a large amount of time and do not lend themselves to collective handling.

PRIOR ART

It is known that an optimum coupling efficiency and great alignment tolerance of a semiconductor guide device (e.g. a semiconductor laser) with an optical fibre are obtained when the divergence of the mode of the device is low and close to that of the mode of the optical fibre. However, the guided modes of a standard semiconductor guide component are generally elliptical and small (approximately 1 to 2 µm), which is equivalent to a high divergence.

However, the monomode optical fibres used for optical telecommunications transport Gaussian circular modes, whose diameter is about 10 microns (e.g. 8 µm for a type G653 displaced dispersion fibre). Consequently, it is necessary for at least one of the two modes to be adapted and to be given the size and divergence of the other.

The use of a fibre, whose end is provided with a lens decreases the size of the mode and increases its divergence on the fibre side (by approximately 2 to 3 µm) and makes it possible to increase the coupling rate, but does not reduce the alignment tolerances.

A more efficient, but technically more difficult solution due to the high refractive index consists of increasing the size of the mode on the semiconductor device side.

Documents (1) to (9) which, like the other documents cited hereinafter, are listed at the end of the description and to which reference should be made, disclose various laser devices and semiconductor amplifiers having a reduced divergence.

All these known devices are based on the integration of an ordinary semiconductor guide (e.g. laser, amplifier, modulator) with a different guide section (amplifier or passive) in which the guide mode is progressively expanded.

This expansion is obtained either by the progressive reduction of the width of the stripe of the guide until a point or tip with sub-micron dimensions are obtained, or by reducing the thickness of said stripe in accordance with a continuous or staircase profile.

The progressive reduction of the lateral and/or vertical dimensions of the stripe leads to a reduction of the effective index of the guide and to a progressive deconfinement of the mode, which is equivalent to a low divergence of the beam liable to be emitted by the guide.

The performance characteristics of the devices with integrated mode adaptors vary in accordance with the complexity of their structures. For example, in certain structures (cf. documents (1) to (5)), a passive guide is provided with a width of approximately 6 to 8 µm and which is located below the active stripe of said structures.

Therefore the mode propagating in the active stripe is progressively coupled in said guide by evanescence, so that the width of the mode on leaving the component is determined by the dimensions of the passive guide.

The smallest divergences parallel or perpendicular to the active layers (planes) of such integrated components vary between 6 and 10°.

The smallest coupling loss values in a fibre, whose end is provided with a lens, is approximately 2 to 3 dB.

In order to avoid the complexity of the integrated structures, another solution has recently been proposed and is explained in document (10). It relates to an active stripe buried laser of constant, very small width of approximately 0.4 µm. This width is optimized in order to achieve the best compromise between the reduction of the divergence due to the limited confinement of the mode and the performance loss linked with the reduction of the modal gain in said laser.

With the guide of very limited width described in document (10), a solution is provided to certain problems, such as the length of the device and the supplementary losses, it being possible to produce distributed feedback lasers or DFB's with better performance characteristics.

However, the reduction of the stripe width (to values as small as 0.4 µm) necessarily leads to a reduction in the performance characteristics of the active devices.

Moreover, not only are the submicron dimensions of the optimized stripe at the limit of the technological control possibilities, but also, for such a narrow guide, the characteristics of the component become less tolerant to geometrical variations.

The analysis of known semiconductor optical devices incorporating a light guide have a reduced divergence and use an integrated mode adaptor, revealing that such devices suffer from numerous disadvantages.

Compared with single function devices (laser, amplification, modulation), the addition of the mode adaptor requires the use of more complex manufacturing procedures with supplementary epitaxial growth stages (in all 4 to 5 stages) and also submicrometric stripe etching stages (often by expensive, direct writing with an electronic masker). This has consequences on the manufacturing efficiency and therefore on the cost of the devices.

In particular, the geometrical tolerances of modal adaptors are often at the limit of technological possibilities, which reduces the control and reproducibility of the emission diagram.

The addition of a transition zone also generally produces a deterioration to the performance characteristics of the components, such as an increase in the operating currents, a power, amplification and absorption reduction, a disturbed emitted optical beam having minor lobes surrounding the major lobe, etc.

In order to ensure as gentle as possible an expansion of the guided mode (adiabatic transformation), the transition zone must have a length of approximately 200 to 400 μm, which introduces supplementary propagation losses and increases the total length of the device to excessive values (approximately 600 to 800 μm), thus reducing the manufacturing efficiency on a 2 inch semiconductor wafer (approximately 5 cm).

Moreover, in the particular case of DFB lasers, the transition zone induces significant disturbances in the longitudinal distribution of the injected charge carriers, known as hole burning, which gives rise to a deterioration of the spectral and dynamic behaviour of such lasers.

DESCRIPTION OF THE INVENTION

The present invention aims at obviating the aforementioned disadvantages by proposing an optical semiconductor light guide device in which the core of the guide comprises at least one layer, whose refractive index is high and fixed by the nature of the device (which can be a laser, a light amplifier, a light modulator or even a simple light guide) and at least one layer having a low refractive index, the latter being lower than the refractive index of each cladding layer of the guide or close thereto.

The guide core width is arbitrary in the present invention.

The device according to the invention can be implemented in simple manner using conventional procedures.

More specifically, the present invention relates to a semiconductor light guide device able to supply a small divergence light beam, the light guide having a core and cladding layers between which the core is positioned, said device being characterized in that the core of the guide comprises a group of semiconductor layers having at least one first semiconductor layer, whose refractive index is higher than the refractive index of each of the cladding layers and at least one second semiconductor layer, whose refractive index is lower than the refractive index of each of the cladding layers or close thereto.

As a result of the present invention, the light beam emerging from the device has a small divergence below 20° in both directions, one being parallel to the layers and the other perpendicular thereto.

The term "refractive index close to that of a cladding layer" means a refractive index equal to that of said cladding layer, or slightly higher by a few % and in all cases less than approximately 5% higher than the latter.

The device according to the invention can comprise a plurality of first semiconductor layers and a plurality of second semiconductor layers alternating with the first semiconductor layers.

In the device according to the invention, the guide core can also comprise third semiconductor layers, whose refractive index is lower than the refractive index of each first semiconductor layer and higher than the refractive index of each second semiconductor layer.

In a first special embodiment, the guide core comprises two third semiconductor layers, placed on either side of said group of layers.

In a second special embodiment, the guide core comprises a plurality of third semiconductor layers, each third semiconductor layer being positioned between a first semiconductor layer and a second semiconductor layer.

The core of the guide of the device according to the invention can be optically inactive, which corresponds to a passive optical device, e.g. a light guide device. Conversely, the guide core can be optically active (and have in this case the shape of a stripe), which corresponds to an active optical device, such as e.g. a laser.

In this case, the guide core can have a compensated strain multiquantum well structure and comprise tension, respectively compression strained well layers, which are chosen for forming said first semiconductor layers, and compression, respectively tension strained barrier layers, chosen for constituting said second semiconductor layers and able to compensate the strains of the well layers.

The present invention more particularly applies to Fabry-Pérot lasers, which have an active zone, which is then formed by the core of the guide constituted in the manner described hereinbefore.

The invention also applies to distributed feedback layers having an active zone provided with a Bragg diffraction grating, said active zone then being formed by the core of the guide constituted in the manner described hereinbefore.

The present invention makes it possible to obtain a semiconductor guide device able to supply a light beam with a small divergence, without suffering from the disadvantages of the aforementioned, known devices and making it possible to reduce said divergence.

In the invention, this divergence reduction is obtained without mode adaptor integration and using conventional production methods, such as e.g. the conventional methods for the production of lasers, light amplifiers, light modulators or buried guides (e.g. buried stripe lasers).

In a device according to the invention, the mean refractive index of the guide core can be adjusted by choosing the respective volumes of the constituent materials of the high refractive index layers (first semiconductor layers) and low refractive index layers (second semiconductor layers).

More particularly, for a core structure corresponding to a low mean refractive index, the effective index of the guide can be reduced, which gives rise to a limited confinement of the mode and to a reduction in the divergence of the beam emerging from the device.

A loss of a modal effect (e.g. absorption/gain/index) of an active device can be compensated, according to the invention, by increasing the overall volume of the core with high index layers and low index layers.

A device according to the invention makes it possible to obtain a beam divergence not exceeding approximately 10 to 15°, in both perpendicular directions, without using a mode adaption zone and using conventional double heterostructure amplifier or laser production procedures, such as BRS technology (two epitaxy stages, one standard photolithography stage and a chemical or dry etching for defining an active stripe having constant lateral and vertical dimensions).

Such a device has an a priori wide stripe making it possible to increase the geometrical tolerances. It is in particular well adapted to reduced divergence distributed feedback lasers as a result of the possibility of retaining a fixed width stripe throughout the device.

However, the invention does not exclude the variation of the geometrical dimensions of the stripe if this proves necessary (e.g. by adding a modal adaptor), which leads to more generous production tolerances than the aforementioned, known devices.

The production of the device according to the invention is particularly adapted to the use of distributed core materials, such as e.g. quantum well materials most frequently used in optoelectronic devices with III–V semiconductor material guides.

BRIEF DESCRIPTION OF THE DRAWINGS

The invention is described in greater detail hereinafter relative to non-limitative embodiments and the attached drawings, wherein show.

DETAILED DESCRIPTION OF EMBODIMENTS

In order to reduce the emission divergence of an optical device having a semiconductor light guide, it is necessary to increase the size of the guided mode. This can be brought about by reducing the optical confinement of said guide.

One of the means permitting such a reduction is the decrease in the refractive index difference between the guide core (which can be an active stripe, such as e.g. in a buried stripe laser) and the cladding layers surrounding said core. This can be brought about by using a guide, whose core is constituted by one or more materials having a low refractive index.

Figure 1:
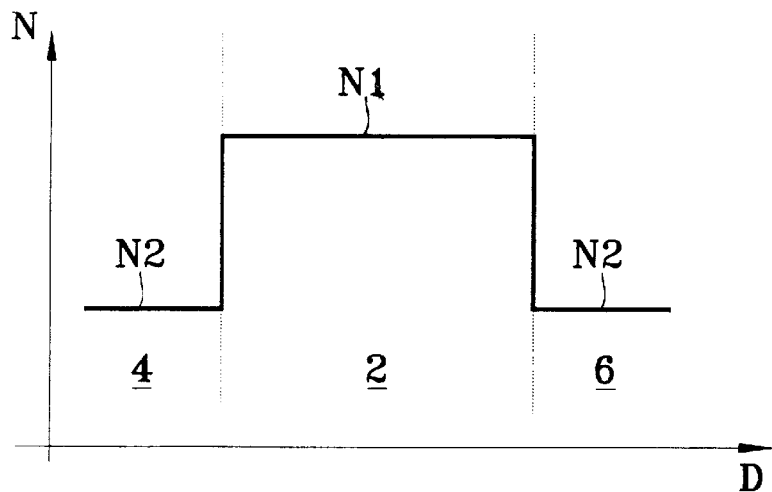
FIGS. 1 and 2 Refractive index variations in conventional, optical semiconductor light guide devices.
Figure 2:
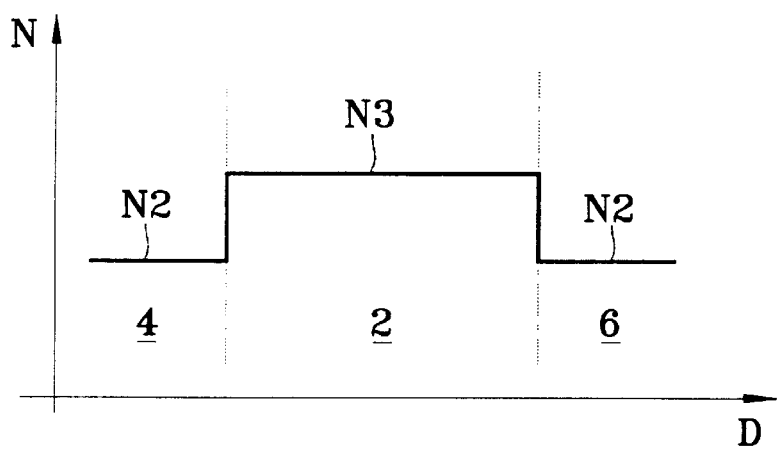

This is diagrammatically illustrated in FIGS. 1 and 2, where it is possible to see the variations of the refractive index N as a function of the distance D, in known light guide devices.

FIG. 1 diagrammatically shows a conventional guide device having a semiconductor material core 2 located between two semiconductor confinement or cladding layers 4 and 6. The refractive index N1 of the core 2 exceeds the refractive index N2 of the cladding layers 4 and 6.

In FIG. 1, as in FIGS. 2 to 5, the distance D is counted along an axis perpendicular to the different layers of the guide (core layer or layers and cladding layers).

FIG. 2 diagrammatically shows a known light guide device with low divergence, in which the core 2 has a refractive index N3 lower than N1, but obviously higher than N2.

As has been seen, in order to maintain the function of the optical device, which imposes the refractive index of each material of the core of the guide of said device (whereby said core can be of one or several materials), the present invention proposes using one or a plurality of layers, which can be referred to as "spacer layers" and whose refractive index is lower than the refractive index of each cladding layer or is close to the latter.

The mean refractive index of the core according to the invention is adjustable by the choice of the respective volumes of the high refractive index core layers (higher than the refractive index of each cladding layer) and low refractive index layers (spacer layers).

Moreover, intermediate refractive index materials, known in the art (such as e.g. materials for separate cladding layers or materials for quantum well barriers) can also be used in the invention for improving the value of the mean refractive index of the core, should this prove necessary. This is diagrammatically illustrated in FIGS. 3 to 5.

Figure 3:
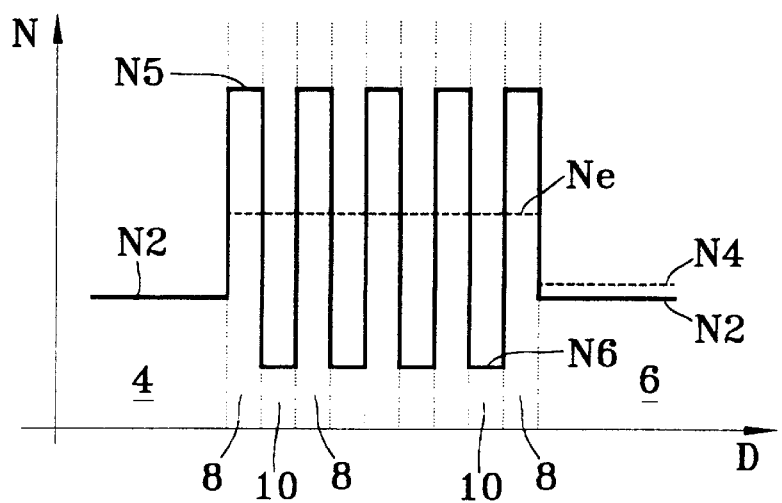
FIG. 3 Refractive index variations in an optical semiconductor light guide device according to the invention.

FIG. 3 diagrammatically and partially shows a device according to the invention, whose core is surrounded by cladding layers 4 and 6 with the same refractive index N2. However, one of the cladding layers, e.g. layer 6, could have a refractive index N4 different from N2.

The core of the device of FIG. 3 comprises semiconductor layers 8 with a high refractive index N5 (higher than the index of each cladding layer) and, according to the invention, semiconductor layers 10 with a low refractive index N6 (below N5). The index N6 of said layers 10 is lower than the index of each cladding layer.

In another, not shown embodiment, N6 is substantially equal to N2 or very slightly exceeds N2, but does not exceed approximately $1.05 \times N2$.

The layers 10 alternate with the layers 8, as can be seen in FIG. 3. Thus, for the core of the device of FIG. 3, an equivalent refractive index Ne is obtained between N2 and N5.

In a not shown embodiment, the core comprises a single high refractive index layer 8 and a single low refractive index layer 10 or a single high refractive index layer 8 surrounded by two low refractive index layers 10.

Figure 4:
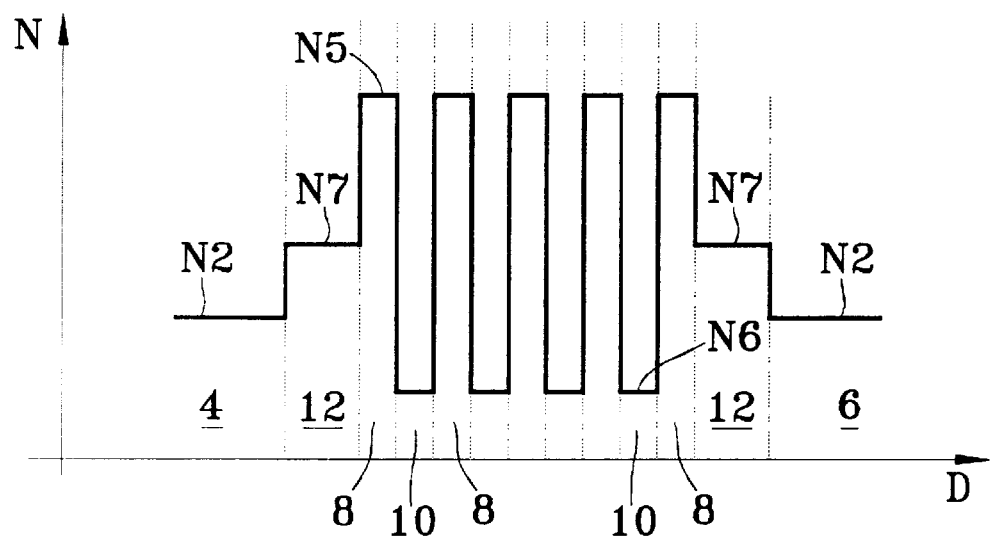
FIG. 4 Refractive index variations in another device according to the invention, in which the guide core comprises intermediate layers on either side of a group of layers having a high refractive index and which alternate with low refractive index layers.

FIG. 4 diagrammatically and partially illustrates another device according to the invention differing from that of FIG. 3 in that the group of layers 8 and 10, which alternate with one another, is surrounded by two intermediate, semiconductor layers 12, whose refractive index N7 is higher than N6 and lower than N5.

Figure 5:
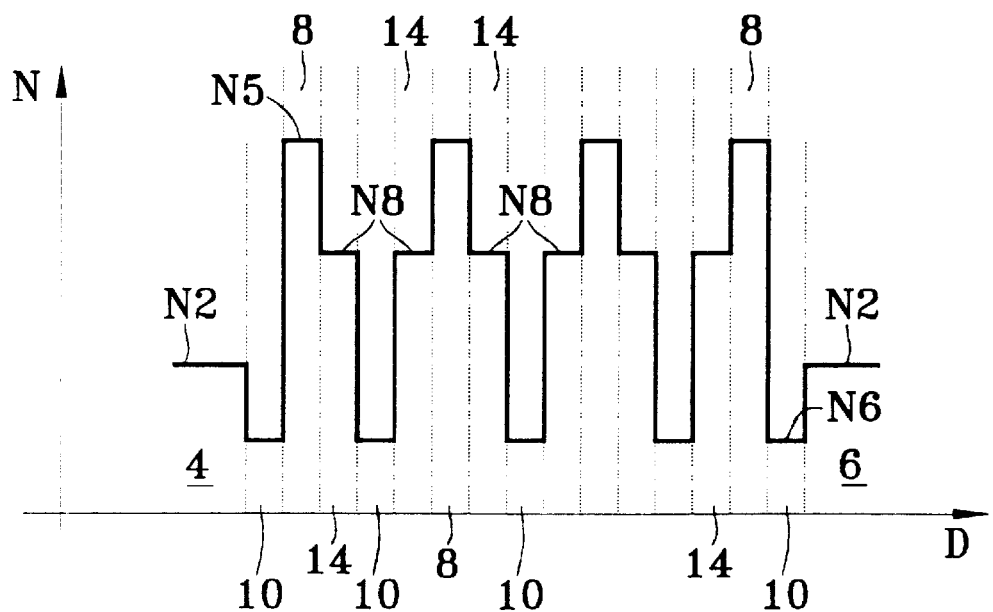
FIG. 5 Refractive index variations in another device according to the invention, in which the guide core comprises intermediate layers, each located between a layer having a high refractive index and a layer having a low refractive index.

FIG. 5 diagrammatically and partially illustrates another device according to the invention, whose core comprises an alternation of high refractive index layers 8 and low refractive index layers 10, as well as intermediate semiconductor layers 14, whose refractive index is between N6 and N5, each intermediate layer 14 being located between two adjacent layers 8 and 10.

In a special embodiment of the invention, the number of high index layers of the core is adjusted as a function of the modal characteristic (e.g. gain, absorption, index change) desired for the device and the number of low refractive index layers of the core is chosen so as to obtain a low, mean refractive index for the guide core.

A laser device according to the invention can e.g. be implemented with a core material constituted by compensated strain multiquantum wells. The well layers of the core are e.g. of alloy InAsP, compression strained and with a refractive index of approximately 3.5. The value of the strain and the thickness of the well layers of the core are dependent on the emission wavelength chosen for the laser.

The barrier layers are of alloy InGaP, tension strained and with a refractive index of approximately 3.18 at the wavelength 1.3 μm. This index of the barrier layers is slightly lower than the index of the confinement or cladding layers of the guide of the device, which are of InP and with a refractive index of 3.20.

The thickness of the barrier layers and the strain thereof are optimized to compensate the strain of the well layers.

The number of wells and the number of barriers is also optimized to permit a vertical light confinement, which is low but adequate for guiding the mode without reducing the performance characteristics of the laser (low threshold current, high quantum efficiency, monomode operation).

Such an arrangement of the layers makes it possible not only to obtain a small emission divergence according to the invention, but also prevents leaks of the charge carriers out of the wells (cf. document (12)), said leaks being the main cause of a reduction in the performance characteristics of lasers operating at high temperatures.

It would obviously also be possible to use a compensated strain multiquantum well structure having tension strained well layers and compression strained barrier layers.

Figure 6:
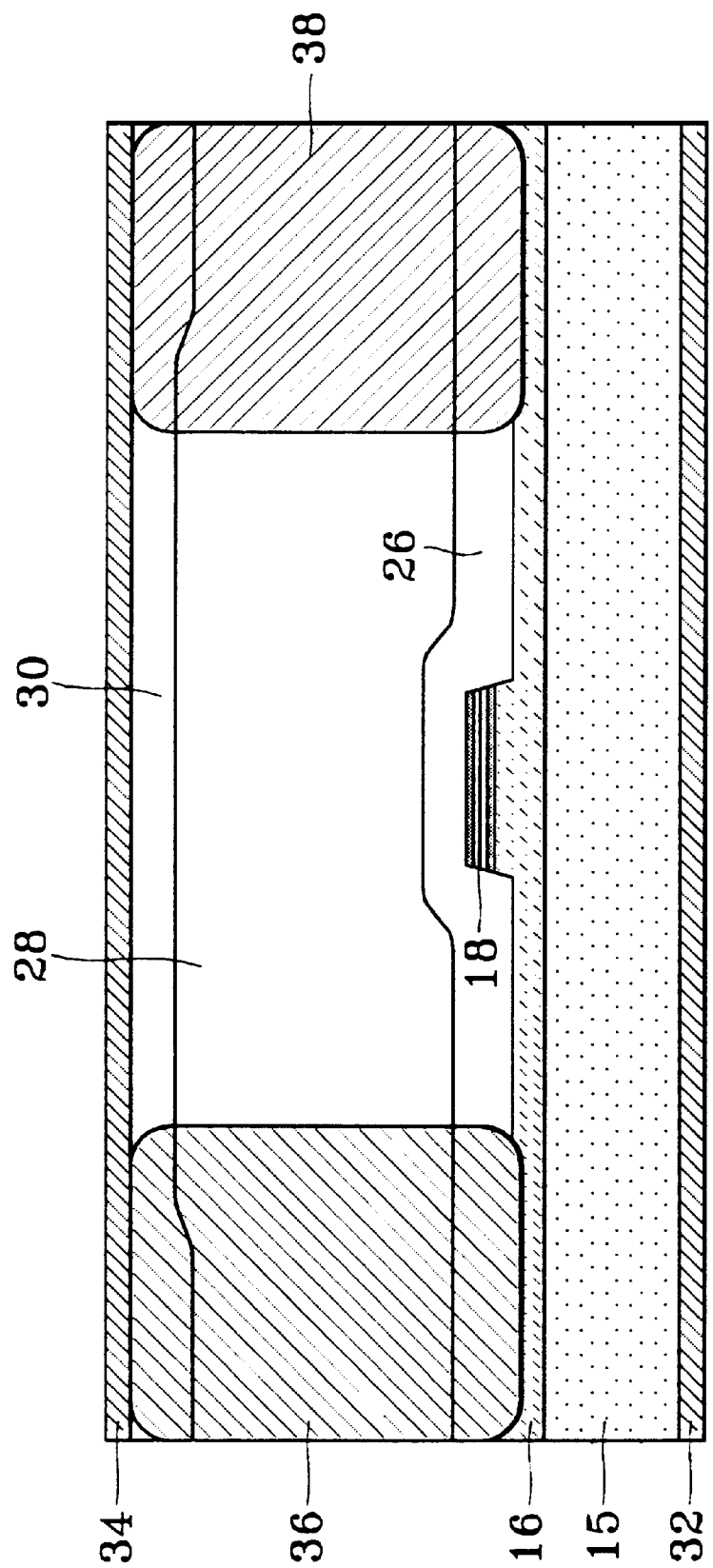
FIG. 6 A cross-sectional, diagrammatic view of another device according to the invention constituting a Fabry-Pérot laser and whose core has a compensated strain multiquantum well structure.

FIG. 6 is a diagrammatic cross-sectional view of a device according to the invention constituting a Fabry-Pérot buried stripe semiconductor laser. The buried stripe is the laser core and has a compensated strain multiquantum well structure.

In this multiquantum well structure, the well layers form the high refractive index layers and the barrier layers form the low refractive index layers, which permit the production by the laser of a low divergence light beam of wavelength 1.3 μm.

Reference should be made to document (11) concerning buried stripe semiconductor lasers.

Figure 7:
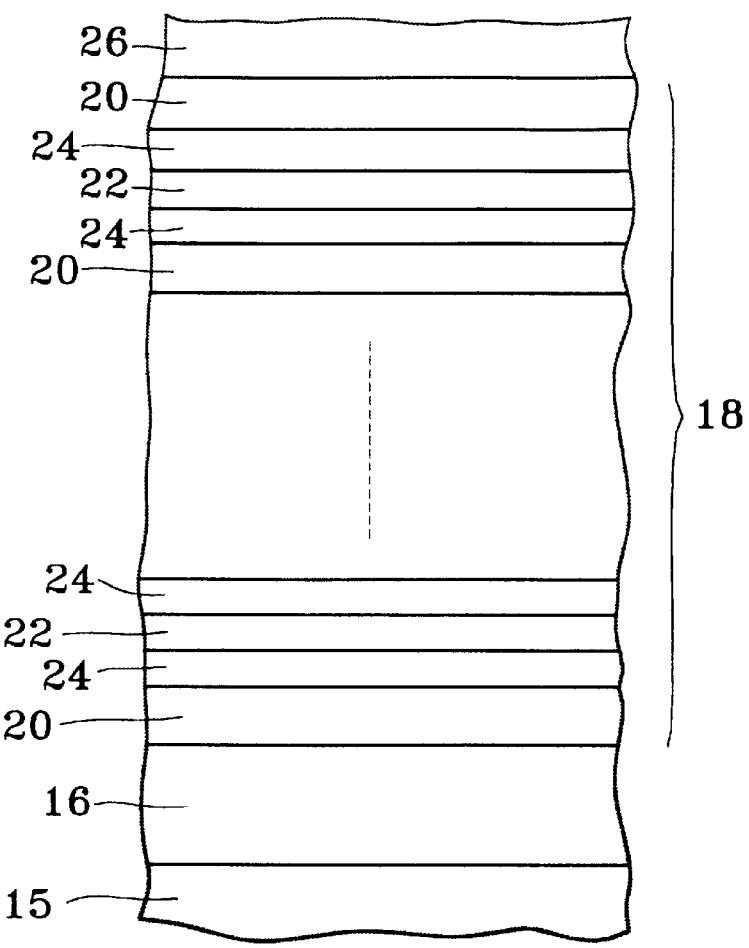
FIG. 7 A cross-sectional, diagrammatic, partial view of the core of the guide of the device of FIG. 6.

FIG. 7 is a larger scale, diagrammatic cross-sectional view of the core of the laser of FIG. 6.

The laser of FIGS. 6 and 7 comprises a type n InP substrate 15 with a doping equal to $2\times10^{18}$ cm$^{-3}$. On the substrate 15, there is also a Si-doped InP cladding layer 16, said type n doping being equal to $2\times10^{18}$ cm$^{-3}$. The thickness of the layer 16 is approximately 1 μm.

On the layer 16, the laser of FIG. 6 also comprises a stripe 18 having a stack of ten well/barrier periods.

As can be seen in FIG. 7, the barrier layers carry the reference 20 and the well layers the reference 22.

Layer 16 is in contact with a barrier layer 20. The last well layer (that furthest removed from layer 16) is surmounted by a supplementary barrier layer 20.

The well layers are of InAsP, have a thickness of 7 nm and a compression strain of 1.7%. The barrier layers are of InGaP, have a thickness of 5 nm and a tension strain of 1.5%.

Moreover, in the particular case of a growth of layers by OMCVD, the stripe 18 comprises InP layers 24 of very limited thickness (1 to 2 monolayers), as can be seen in FIG. 7. These layers 24 are inserted between the well layers and the barrier layers.

The stripe 18 is buried in another Zn-doped InP cladding layer 26, said type p doping being equal to $7\times10^{17}$ cm$^{-3}$. The layer 26 is approximately 0.3 μm thick. Layer 26 is surmounted by a thick, Zn-doped InP layer, said type p doping being equal to $2\times10^{18}$ cm$^{-3}$. The layer 28 is approximately 3 μm thick.

The laser of FIG. 6 also comprises a contact layer 30 covering the layer 28 and which is of Zn-doped InGaAs, said type p doping being equal to $3\times10^{19}$ cm$^{-3}$. Layer 30 is approximately 0.3 μm thick.

The laser of FIG. 6 also comprises a Ti/Pt/Au metallization layer 32, which covers the face of the substrate 15 opposite co that on which the layer 16 is located. The contact layer 30 is covered by another Pt/Au metallization layer 34.

Proton implantation zones 36 and 38 are also provided on either side of the stripe 18, as can be seen in FIG. 6.

An explanation will now be given of a process for the production of the device of FIG. 6.

On substrate 15 is firstly formed the layer 16 and then, by OMCVD or any other growth process such as gas source molecular beam epitaxy (GSMBE) or chemical beam epitaxy (CBE), formation takes place of the vertical structure constituted by the stack of well layers and barrier layers 20 and 22, between which are inserted the thin layers 24 when the OMCVD method is used. In this case, the presence of the layers 24 is highly desirable.

Thus, despite the strain compensation, the stack of high strain layers 20 and 22 gives rise to an undulation of the thicknesses of the layers in a direction perpendicular to the growth direction. This undulation increases with the number of wells and leads to a deterioration of the material.

In order to obviate this disadvantage, the growth of the materials takes place at a low temperature (approximately 600° C.) and layers 24 are added between the well layers and the barrier layers.

Then, through a silicon nitride or photosensitive resin mask, definition takes place by photolithography of the 2.8 μm wide stripe 18. This stripe width is optimized for the given layer structure, so that the said structure permits a monomode guidance with a low effective refractive index.

The semiconductor is then etched to the lower layer 16 through the previously formed mask. Preference is given to dry etching (RIBE or RIE), but wet etching is also possible.

Then, following the complete removal of the mask and the cleaning of the structure obtained, successive deposition takes place of the layers 26 and 28 in order to bury the stripe formed, followed by the deposition of the highly doped contact layer 30.

The significant thickness of at least 2 μm of the layer 28 prevents the guided and expanded mode of the laser from reaching the very absorbing layer 30.

This is followed by the production of an ohmic contact on the p side of the laser, by depositing a 150 nm thick Pt layer, followed by annealing at 420° C.

This is followed by the ion implantation of protons on either side of the active stripe 18 through a 6 μm wide, photosensitive resin mask.

After reducing the thickness of the substrate 15, deposition takes place of the Ti/Pt multilayer on the rear face of the substrate, followed by the deposition of a gold layer on the p and n sides of the laser and the faces thereof are cleaved.

The authors of the present invention have experimentally checked the performance characteristics of such a laser. Along 400 μm, it has a threshold current of approximately 15 to 20 mA.

The continous$_{13}$output power exceeds 60 mW per face with two cleaved faces and 110 mW with one cleaved face and one high reflectivity face (95%).

A direct current laser operation at a temperature of 100° C. and with an emitted power exceeding 10 mW was also observed on this laser. The divergence of the beam, measured at mid-height, is below 10° in the direction parallel to the plane of the p-n junction of the laser and below 20° in the direction perpendicular to said plane.

The coupling rate to a cleaved optical fibre is below 4.5 dB and the alignment tolerances are +/−2.2 µm laterally and +/−1.9 µm vertically.

Figure 8:
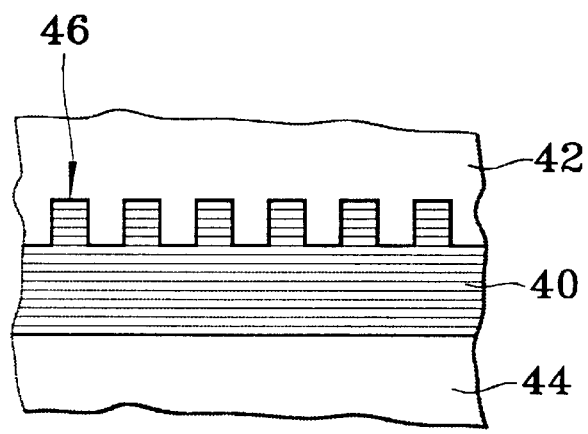
FIG. 8 A diagrammatic, partial, longitudinal sectional view of another device according to the invention constituting a distributed feedback layer and whose core has a multiquantum well structure.

FIG. 8 diagrammatically and partially illustrates another device according to the invention constituting a distributed feedback laser. FIG. 8 shows the laser core 40. It is also possible to see the cladding layers 42 and 44 between which the core 40 is located.

According to the invention, said core 40 has a multiquantum well structure with e.g. fifteen well and barrier periods.

The well layers constitute the high refractive index layers and the barrier layers the low refractive index layers permitting the obtaining of a low divergence light beam. The laser also comprises a diffraction grating 46 positioned above the core 40.

This grating 46 is obtained by etching the group of well and barrier layers over a depth corresponding to e.g. 5 of said layers. This gives a complex coupling.

In a not shown embodiment, the diffraction grating is etched in a semiconductor layer between the cladding layer 42 and the active multiquantum well zone, in order to obtain an index coupling.

The following documents are cited in the present description:

(1) R. Zengerle, H. Brückner, H. Olzhausen and A. Kohl, "Low-loss fibre-chip coupling by buried laterally tapered InP/InGaAsP wave-guide structure, Electronics Letters, Mar. 26, 1992, vol. 28, No. 6, pp 631–632

(2) B. Mersali, H. J. Brücker, M. Feuillage, S. Sainson, A. Ougazzaden and A. Carenco, "Theoretical and experimental studies of spot-size transformer with integrated waveguide for polarization insensitive optical amplifiers", Journal of Lighwave Technology, vol. 13, No. 9, September 1995, pp 1865–1872

(3) I. F. Lealman, L. J. Rivers, M. J. Harlow and S. D. Perrin, "InGaAsP/InP tapered active layer multiquantum well laser with 1.8 dB coupling loss to cleaved single mode fibre", Electronics Letters, Sep. 29, 1994, vol. 30, No. 20, pp 1685–1687

(4) R. Ben-Michael, U. Koren, B. I. Miller, G. Young, M. Chien and G. Raybon, "InP-based multiple quantum well lasers with an integrated tapered beam expander waveguide", IEEE photonics technology letters, vol. 6, No. 12, December 1994, pp 1412–1414

(5) A. Kasukawa, N. Iwai, N. Yamanaka and N. Yokouchi, "Output beam characteristics of 1.3 µm GaInAsP/InP SL-QW lasers with narrow and circular output beam", Electronic Letters, Mar. 30, 1995, vol. 31, No. 7, pp 559–560

(6) H. Fukano, Y. Kadota, Y. Kondo, M. Ueki, Y. Sakai, K. Kasaya, K. Yokoyama and Y. Tohmori, "1.3 µm large spot-size laser diodes laterally tapered active layer", Electronics Letters, Aug. 17, 1995, vol. 31, No. 17, pp 1439–1440

(7) P. Doussière, P. Garadebian, C. Graver, E. Derouin, E. Gaumont-Goarin, C. Michaud and R. Meuilleur, "Tapered active stripe for 1.5 µm InGaAsP/InP strained multiple quantum well lasers with reduced beam divergence", Appl. Phys. Lett., 64(5), Jan. 31, 1994, pp 539–541

(8) I. Moerman, M. D'Hondt, W. Vanderbauwhede, P. Van Daele, P. Demeester and W. Hunziker, "InGaAsP/InP strained MQW laser with integrated mode size converter using the shadow masked growth technique", Electronics Letters, Mar. 16, 1995, vol. 31, No. 6, pp 452–454

(9) Y. Tohmori, Y. Suzaki, H. Oohashi, Y. Sakai, Y. Kondo, H. Okamoto, M. Okamoto, Y. Kadota, O. Mitomi, Y. Itaya and T. Sugie, "High temperature operation with low-loss coupling to fibre for narrow-beam 1.3 µm lasers with butt-jointed selective grown spot-size converter", Electronics Letters, Oct. 12, 1995, vol. 31, No. 21, pp 1838–1840

(10) H. Fukano, K. Yokoyama, Y. Kadota, Y. Kondo, M. Ueki and J. Yoshida, "Low cost, high coupling-efficient and good temperature characteristics 1.3 µm laser diodes spot-size transformer", Proc. 21st Eur. Conf. on Opt. Comm. (ECOC 95-Brussels)

(11) FR-A-2 673 330, N. Bouadma, "Process for producing a buried stripe semiconductor laser using dry etching for forming said stripe and laser obtained by this process", French patent application 91 02272 of 26.2.1991, cf. also EP-A-501 862 and U.S. Pat. No. 5,304, 283 and N. Bouadma et al. "Over 245 mW 1.3 µm buried ridge stripe laser diodes on n-substrate fabricated by the reactive ion beam etching technique", Appl. Phys. Lett., vol. 59, No. 1, Jul. 1, 1991, pp 22–24

(12) A. Ougazzaden, A. Mircea and C. Kazmierski, "High temperature characteristics $T_0$ and low threshold current density of 1.3 µm InAsP/InGaP/InP compensated strain multiquantum well structure lasers", Electronics Letters, May 11, 1995, vol. 31, No. 10, pp 803–804.

What is claimed is:

1. Semiconductor light guide device able to supply a small divergence light beam, the light guide having an optically efficacious core and cladding layers (4, 6; 16, 26; 42, 44) between which the core is positioned, said device being characterized in that the core of the guide includes a group of semiconductor layers having at least one first semiconductor layer (8; 20), whose refractive index is higher than the refractive index of each of the cladding layers and at least one second semiconductor layer (10; 22), whose refractive index is less than or equal to an index of refraction which is 5% greater than the refractive index of either of the cladding layers.

2. Device according to claim 1, characterized in that the core is optically inactive.

3. Semiconductor light guide device able to supply a small divergence light beam, the light guide having an optically efficacious core and cladding layers (4, 6; 16, 26; 42, 44) between which the core is positioned, said device being characterized in that the core of the guide includes a group of semiconductor layers having at least one first semiconductor layer (8; 20), whose refractive index is higher than the refractive index of each of the cladding layers and at least one second semiconductor layer (10; 22), whose refractive index is less than or equal to an index of refraction which is 5% greater than the refractive index of either of the cladding layers, the light guide further characterized in that it comprises a plurality of first semiconductor layers (8; 20) and a plurality of second semiconductor layers (10; 22) alternating with the first semiconductor layers.

4. Device according to claim 3, characterized in that the core further includes third semiconductor layers (12; 14), whose refractive index is lower than the refractive index of each first semiconductor layer and is higher than the refractive index of each second semiconductor layer.

5. Device according to claim 4, characterized in that there are two third semiconductor layers (12), one of the third semiconductor layers placed on a first side of said group of semiconductor layers and the other third semiconductor layer placed on a second side of said group of semiconductor layers.

6. Device according to claim 4, characterized in that there are a plurality of third semiconductor layers (14), each third semiconductor layer being located between a first semiconductor layer (8) and a second semiconductor layer (10).

7. Device according to claim 3, characterized in that the number of first semiconductor layers (8) is adjusted as a function of the modal characteristic desired for the device and in that the number of second semiconductor layers (10) is chosen so as to obtain a low mean refractive index for the core.

8. Device according to claim 3, characterized in that the core (18; 40) is optically active.

9. Device according to claim 8, characterized in that the core (18; 40) has a compensated strain multiquantum well structure and comprises strained well layers (20), which are chosen for forming said first semiconductor layers, and strained barrier layers (22), which are chosen for forming the said second semiconductor layers and which are able to compensate the strains of the well layers.

10. Device according to claim 8, wherein said device is a Fabry-Perot laser and said device having an active zone, characterized in that said active zone is constituted by said core (18).

11. Device according to claim 8, wherein said device is a distributed feedback laser and said device having an active zone provided with a Bragg diffraction grating, characterized in that the active zone is constituted by said core (40).

12. Device according to claim 3, wherein each first semiconductor layer has substantially the same refractive index as the other first semiconductor layers, and each second semiconductor layer has substantially the same refractive index as the other second semiconductor layers.

13. Device according to claim 3, wherein each first semiconductor layer has substantially the same thickness as the other first semiconductor layers, and each second semiconductor layer has substantially the same thickness as the other second semiconductor layers.

14. Device according to claim 3, wherein each first semiconductor layer has substantially the same refractive index and substantially the same thickness as the other first semiconductor layers, and each second semiconductor layer has substantially the same refractive index and substantially the same thickness as the other second semiconductor layers.

15. Device according to claim 2, characterized in that the core includes:

- two sets of immediately adjacent first and second semiconductor layers, each set respectively located adjacent one of the cladding layers;
- a series of first semiconductor layers and a series of second semiconductor layers located between the sets of semiconductor layers, the second semiconductor layers of the series of second semiconductor layers alternating with the first semiconductor layers of the series of first semiconductor layers;
- a series of third semiconductor layers;
- wherein a third semiconductor layer from the series of third semiconductor layers separates each first and second semiconductor layers located between the sets.

* * * * *